United States Patent [19]

Turner et al.

[11] Patent Number: 5,680,103

[45] Date of Patent: Oct. 21, 1997

[54] METAL DETECTION SYSTEM

[75] Inventors: John Edward Turner; Tom Scrivner; Robert F. Turner, all of El Paso, Tex.

[73] Assignee: Ranger Security Detectors, Inc., El Paso, Tex.

[21] Appl. No.: 614,687

[22] Filed: Mar. 13, 1996

Related U.S. Application Data

[63] Continuation-in-part of Ser. No. 183,696, Jan. 19, 1994, Pat. No. 5,521,583.

[51] Int. Cl.⁶ .................................................. G08B 13/24
[52] U.S. Cl. ........................................... 340/551; 324/243
[58] Field of Search .................................. 340/551, 572, 340/825.31, 825.34; 348/143; 324/239, 243; 359/142; 341/176

[56] References Cited

U.S. PATENT DOCUMENTS

| | | | |
|---|---|---|---|
| 3,697,972 | 10/1972 | Brown | 340/551 X |
| 3,758,949 | 9/1973 | Susman et al. | 340/551 X |
| 3,763,424 | 10/1973 | Bennett, Jr. et al. | 340/551 X |
| 3,896,371 | 7/1975 | Hametta | 324/327 |
| 3,950,696 | 4/1976 | Miller et al. | 324/234 |
| 4,293,816 | 10/1981 | Johnson | 324/329 |
| 4,486,712 | 12/1984 | Weber | 324/329 |
| 4,560,935 | 12/1985 | Williams | 324/326 |
| 4,829,546 | 5/1989 | Dueckman | 340/541 X |
| 4,866,424 | 9/1989 | Parks | 340/572 X |
| 4,906,973 | 3/1990 | Karbowski et al. | 340/551 |
| 5,039,981 | 8/1991 | Rodriguez | 340/551 |
| 5,148,151 | 9/1992 | Podhrasky | 340/572 |
| 5,521,583 | 5/1996 | Frahm et al. | 340/551 |

Primary Examiner—Thomas Mullen
Attorney, Agent, or Firm—Harold E. Meier

[57] ABSTRACT

A walk-through metal detection system with split field generation coils excited in phase to generate an electromagnetic field having a substantially uniform vertical field density. A plurality of vertically distributed receiver coils are also provided, each receiver coil connected to a separate detector circuit for detecting disturbances in the generated field caused by the presence of metal objects. The signals are processed to generate an output signal indicative of the individual metal mass (or masses) of objects detected within the generated electromagnetic field. The output signal is compared to a threshold signal, and if greater than the threshold signal, then a metal object is presumed to be present within the electromagnetic field and an alarm is sounded. A remote control may be used by an operator to adjust the threshold signals. Additional processing of the detector circuit outputs differentiates between a single object of large metal mass and multiple objects of combined metal mass. The detector circuit outputs may be processed to differentiate between ferrous and non-ferrous metal objects and differentiate between the metal compositions of various metal objects.

15 Claims, 6 Drawing Sheets

Fig.6   TO OSCILLATOR

METAL DETECTION SYSTEM

RELATED APPLICATIONS

This application is a continuation-in part application under 37 C.F.R. § 1.53 of U.S. application Ser. No. 08/183, 696, filed Jan. 19, 1994, now U.S. Pat. No. 5,521,583.

TECHNICAL FIELD

The present invention relates to metal detectors and, in particular, to an improved walk-through metal detection system.

BACKGROUND OF THE INVENTION

In recent years, walk-through metal detectors have become a commonly utilized piece of security equipment. While most people are familiar with, and accustomed to the use of such detection systems in airports, the state of society today has unfortunately necessitated the use of walk-through metal detection systems in such unconventional locations as schools and courthouses. Regardless of place of use, the primary continuing function of walk-through metal detection systems is to accurately detect the presence of hidden illicit metal objects such as firearms and knives on the body of an individual.

The operation of prior art walk-through detection systems for the purpose of detecting illicit metal objects, however, has been less than satisfactory in at least four ways. First, the detection electromagnetic field generated by prior art transmit-receive coils in walk-through detection systems is plagued by the presence of weak or "dead" spots through which a person may pass an illicit metal object without detection. Alternatively, the detector may be set to respond to objects in the weak or "dead" spots, but unfortunately this causes the detector to be hyper-sensitive in the areas with normal response to trigger undesired metal alarms. Second, the prior art electronic systems that provide for processing the signals output from the transmit-receive coils lack the capability of discriminating between illicit and permissible metal objects. Thus, large metal buttons, pocket change and belt buckles are often identified, quite to the annoyance of the person being scanned, as illicit metal objects. Third, the prior art electronics systems for metal detectors have no provision for discriminating against the cumulative sum total metal mass of small, permissible metal objects versus the metal mass of a single, large, illicit metal object. This drawback is the largest source of undesired metal alarms, thus necessitating additional security personnel to perform time consuming searches. Fourth, the prior art electronic systems further lack the capability of approximately identifying on the body of an individual the location of the carried metal object triggering the alarm. Thus, security agents often require a near complete disrobing of the scanned individual to locate the offending metal object and determine whether the object is illicit.

Accordingly, there is a need for an improved walk-through metal detection system that provides for a more uniform generation of the detection electromagnetic field, is capable of discriminating between illicit and permissible metal objects, is capable of discriminating between cumulative and lumped metal mass, and is capable of identifying the approximate location of the carried metal object triggering the alarm.

SUMMARY OF THE INVENTION

In accordance with the present invention, a unique configuration of the transmit-receive coil for a walk-through metal detector is provided. The transmit coil comprises a single coil of wire split in half and excited in phase, with one half of the split coil positioned on either side of a passageway for the walk-through metal detection system. Positioned adjacent each half of the split transmit coil is a separate receive coil. The combined transmit-receive coil is configured with a vertically elongated geometry. Due to mutual coupling between the split transmit coils, an electromagnetic field having a substantially uniform vertical field density (i.e., virtually no weak or "dead" spots) is generated, the field concentrated in the passageway. With a uniform vertical field, accurate detection of metal objects may be made regardless of relative position within the passageway.

The electronic system for the walk-through metal detection system of the present invention includes a separate detector circuit connected to each receive coil. The signals output from the detector circuits are processed to generate an output signal indicative of the total metal mass detected within the generated electromagnetic field. The output signal is compared to a threshold signal, and if greater than the threshold signal, an illicit metal object is presumed to be present within the electromagnetic field and an alarm is sounded. The use of separate detectors provides maximum sensitivity for discriminating between illicit and permissible metal objects by providing a response to an accurate approximation of true metal mass. Approximate horizontal position of the detected metal object may also be determined.

In accordance with another embodiment of the present invention, each receive coil on either side of the passageway comprises a plurality of individual receive coils. Each individual receive coil in the plurality of coils is connected to a separate detector circuit outputting a complex phase and amplitude signal indicative of the detection of metal object (s) within the electromagnetic field. Each of the plurality of phase amplitude signals are converted to digital signals and processed using digital signal processing techniques to identify the metal object(s) disrupting the electromagnetic field. The use of dual multiple receive coils with digital signal processing facilitates not only the discrimination between illicit and permissible metal objects by determining individual lumped metal mass, but also the determination of both the approximate vertical and horizontal position of the metal object detected in the field.

In accordance with another embodiment of the present invention, specific metal objects are identifiable by digitally processing voltage signals, amplitude signals, and metal mass signals for the specific object. The three signals are digitally modeled to provide a distinctive identification signature. The distinctive signature is compared to distinctive signatures for known objects stored in the central processing unit memory. The likely identity of the specific object in question may be output to a display, graphically, textually or by an audible alarm signal.

BRIEF DESCRIPTION OF THE DRAWINGS

A more complete understanding of the metal detection system of the present invention may be had by reference to the following Detailed Description when taken in conjunction with the accompanying Drawings wherein.

DETAILED DESCRIPTION OF THE DRAWINGS

Figure 1:
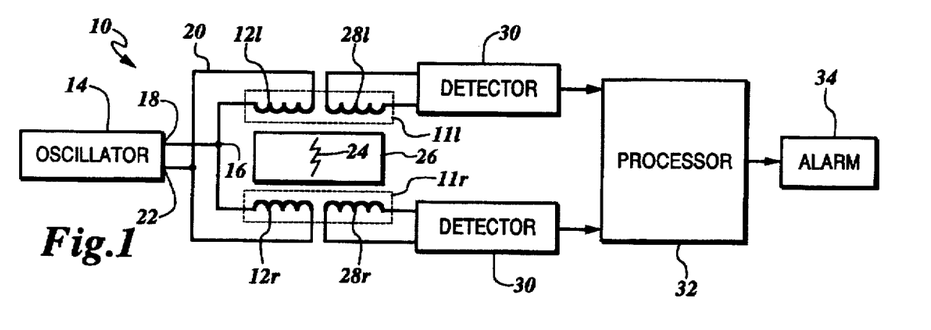
FIG. 1 is a block diagram of a first embodiment of the metal detection system of the present invention.

Referring now to FIG. 1, there is shown a block diagram of a first embodiment of the metal detection system 10 of the present invention. The system 10 utilizes a pair of multiple turn, very low frequency coil sets 11 positioned on either side of a passageway 26 through which persons or articles pass for scanning and detection of illicit metal objects. The system 10 utilizes a field generation coil 12 divided between the coil sets 11 and connected to a single oscillator circuit 14. The single coil of wire for the field generation coil 12 is split at its mid-point 16 into a right coil 12r for one coil set 11r and a left coil 12l for the other coil set 11l. The split coils are connected in parallel, with the mid-point 16 coupled to one alternating current port 18 of the oscillator 14 and the ends 20 connected together and to another alternating current port 22. The right and left field generation coils 12r and 12l are excited in phase by the oscillator 14 to generate a single alternating current electromagnetic field 24 concentrated with substantially uniform field density in the passageway 26.

The presence of metal objects in the passageway 26 causes a disturbance in the electromagnetic field 24 generated by the co-phased field generation coils 12. This disturbance is sensed by dual, right and left receive coils 28r and 28l, respectively, that, like the split transmit coil 12, are also positioned in the coil sets 11r and 11l on opposite sides of the passageway 26. Each receive coil 28 in a coil set 11 is connected to a corresponding detector circuit 30 that detects the field disturbance. A processor 32 takes the approximate cube roots of the signal outputs from the detector circuits 30, redundantly multiplies and cross-differentiates the cube roots, and selects the lesser result (weaker signal) as an analog approximation of the total mass of the metal object(s) detected in the passageway 26. If the determined metal mass exceeds a predetermined threshold mass level, then an alarm 34 is sounded indicating the presence and detection of an illicit metal object. Although the preferred embodiment of the detector circuit 30 and processor 32 comprises analog circuit devices, it will, of course, be understood that the requisite detection and processing functions may be implemented using digital signal processing techniques as well.

Figure 2:
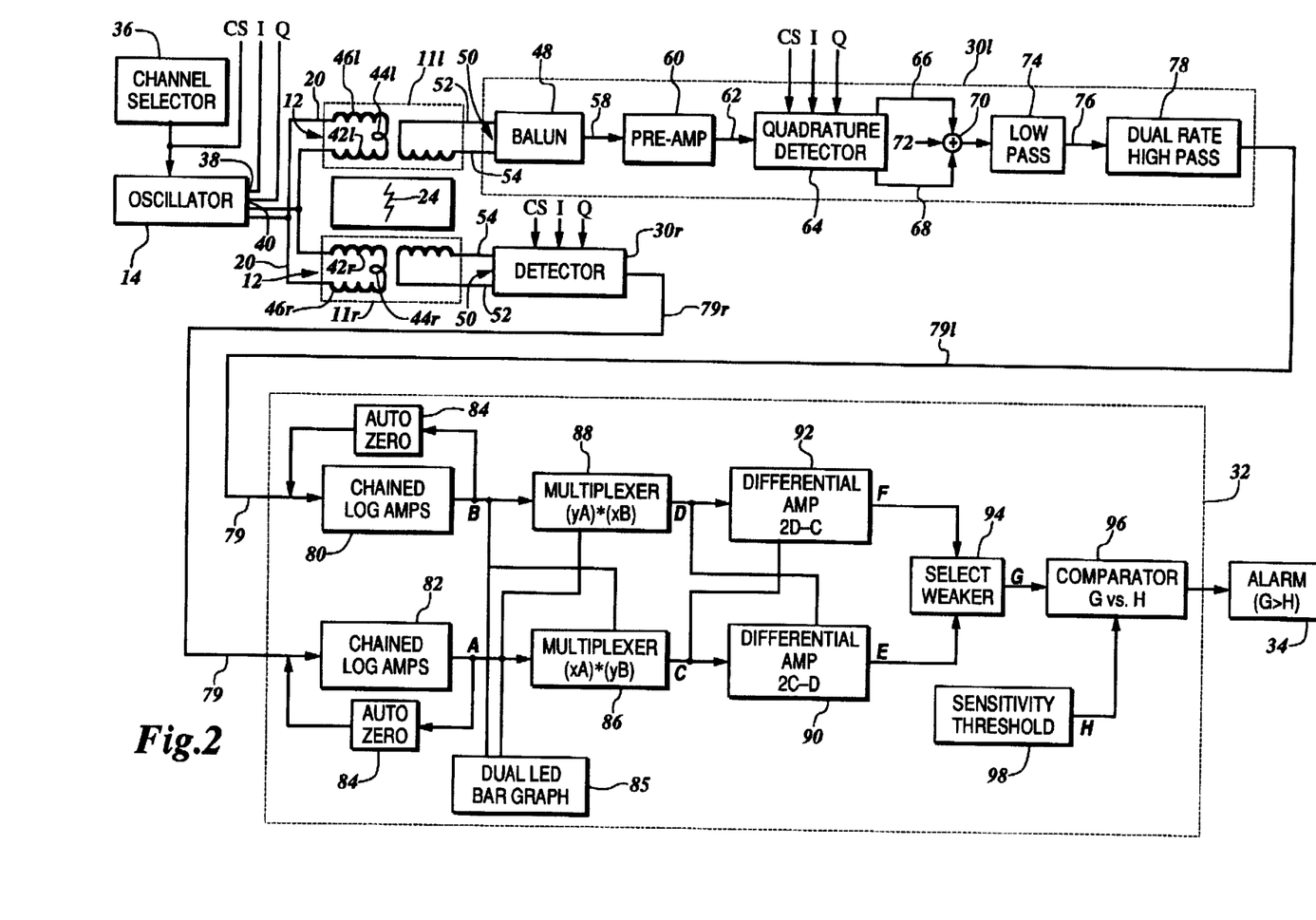
FIG. 2 is a more detailed block diagram of the first embodiment of the system shown in FIG. 1.

Reference in now made to FIG. 2, wherein there is shown a more detailed block diagram of the first embodiment of the metal detection system 10 of FIG. 1. A channel selector circuit 36 is connected to the oscillator 14 to allow for the selection (signal CS) by the system user of different frequencies (preferably approximately 6 kilohertz, with 100 hertz separating the channels) for the generated alternating current electromagnetic field 24. Slight phase adjustments in the generated alternating current signal are also possible with the selector circuit 36. With proper frequency and phase selection, multiple systems 10 are operable in close proximity to each other with minimal interference to adversely affect performance. The oscillator 14 further includes two square wave outputs 38 and 40. The first output 38 provides a square wave in phase (signal I) with the generated electromagnetic field 24. The second output 40 provides a square wave in quadrature phase (signal Q) with the signal exciting the generated electromagnetic field 24.

Although illustrated in FIG. 1 as a single coil, each side of the field generation coil 12 in a coil set 11 is preferably comprised of three separate elements. The first element is a transmit coil 42r and 42l, the second element is a null adjust loop 44r and 44l, and the third element is a feedback coil 46r and 46l. The three elements of the field generation coil 12 in each coil set 11 are connected in series between the mid-point 16 and the coil end 20.

Figure 3:
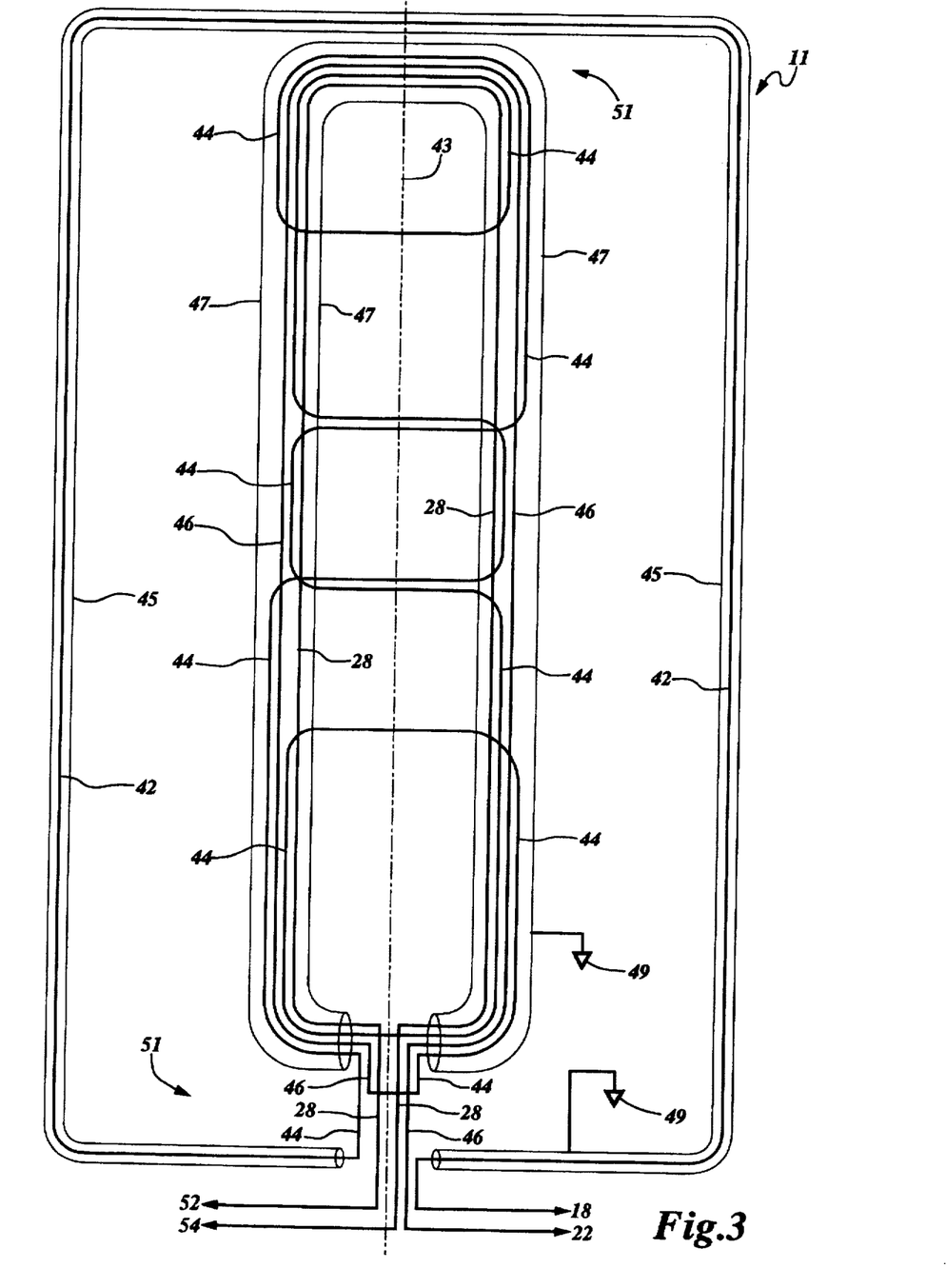
FIG. 3 illustrates the geometry of one of the transmit-receive coils in the first embodiment of the metal detection system shown in FIG. 2.

Reference is now made to FIG. 3 wherein there is shown the geometry of one coil set 11 positioned on one side of the passageway 26. It will, of course, be understood that a mirror image of the coil geometry illustrated in FIG. 3 is present in the coil set 11 on the opposite side of the passageway 26.

The transmit coil 42 for the field generation coil 12 has rounded corners and an elongated rectangular shape having a longitudinal axis 43 of symmetry. The null adjust loop 44 is coaxially aligned with the transmit coil 42 having a similar elongated rectangular shape with rounded corners. The null adjust loop 44 has a narrower width and a slightly shorter length than the transmit coil 42. The feedback coil 46 is co-planar with and also coaxially aligned with the transmit coil 42, and is co-located with and has a substantially identical overall size and shape as the null adjust loop 44. Similarly, the receive coil 28 is also co-planar and coaxially aligned with the transmit coil 42, and is co-located with and has a substantially identical overall size and shape as the null adjust loop 44 and feedback coil 46.

The transmit coil 42 is shielded with a resistive Faraday split section tubular shield 45 that is terminated to system ground 49. The co-located receive coil 28 and feedback coil 46 are gathered together and also shielded with a resistive Faraday split section tubular shield 47 that is terminated to system ground 49. Termination of the shields 45 and 47 to system ground provides primary electromechanical interference and radio frequency interference suppression. Openings in the tubular shields 45 and 47 are selectively located near the longitudinal ends of the coils to minimize loading of the generated electromagnetic field 24.

By co-locating the null adjust loop 44, the receive coil 28 and the feedback loop 46 in the coil set 11, the sensitivity of the system 10 near the longitudinal end regions 51 of the coil structure is enhanced. The null adjust loop 44 further includes a plurality of null adjust wire crossover points for shaping the generated electromagnetic field 24. With proper null adjustment, a substantially uniform electromagnetic field, free from weak or "dead" spots, is generated.

Referring again to FIG. 2, each detector circuit 30 includes a balun 48 for terminating a corresponding one of the receive coils 28r and 28l. The balun 48 provides a balanced input 50 connected to the ends 52 and 54 of the receive coil 28, thus allowing the receive coils 28 to operate with a relatively high resonant frequency providing increased sensitivity. The balun 48 incorporates input low pass filtering circuitry to provide both electromechanical and radio frequency interference suppression. The balun 48 further converts the balanced input 50 to a single ended, unbalanced termination 58. The unbalanced signal at termination 58 is applied to a pre-amp circuit 60 that incorporates further low pass filtering and shifts the phase of the unbalanced signal to output a pre-amp signal on line 62. The phase of the pre-amp signal is preferably shifted in comparison to the phase of the two square wave signals 38 and 40 output from the oscillator 14 as needed to provide an all metals response for the detector circuit output.

The pre-amp output signal on line 62 is applied to a quadrature detector 64 having DC coupled phase 66 and amplitude 68 outputs. The in phase (I) and quadrature phase (Q) square wave signals output from the oscillator 14 are also applied to the quadrature detector 64. Selection of the static operating point for the detector 64 is made by the channel selector 36 with the channel select signal (CS) to match the frequency selected for the generated alternating current electromagnetic field 24. A slight phase adjustment may also be provided by the channel selector 36 to compensate for a response shift in the receive coils 28 when the system 10 is operated on the various selected operating frequencies.

The DC coupled outputs 66 and 68 are summed at 70, and the dynamic response of the system adjusted at 72 (with respect to the summed amplitude and phase components) to provide a predetermined metal slope response for the receive coil 28. The metal slope response refers to a balancing of the detector circuit 30 operation to detect all metals (both ferrous and non-ferrous) equally well. The adjusted signal output from summer 70 is applied to a low pass filter 74 that filters out high frequency noise components and sets the maximum walk-through rate for metal object detection. This maximum rate allows for typical leg swing velocities.

Figure 7:
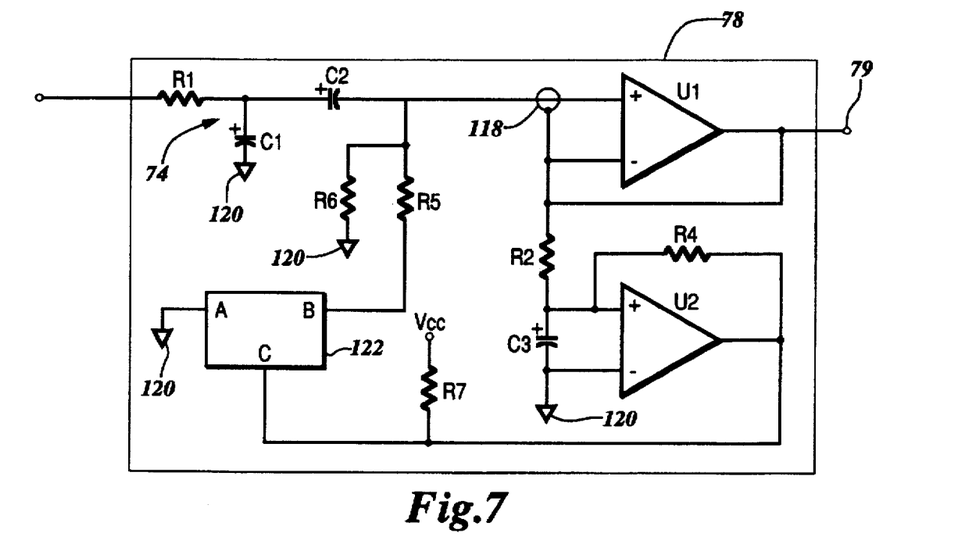
FIG. 7 is a circuit diagram for the dual rate, high pass filter for the system of FIGS. 1 and 2.

Following low pass filtering, the filtered signal output on line 76 is AC coupled to a dual rate high pass filter 78 that includes precision comparators for detecting whether an object is approaching or departing from the passageway 26. If the object is detected as approaching, the filter 78 is set to a slow rate for processing the filtered signal on line 76 and generating a detector output signal on line 79. This allows the system to accurately process slow moving objects. Conversely, if the object is detected as departing, the filter 78 is set to a high rate for processing the filtered signal and generating the detector output signal on line 79. This allows the system to quickly reset for a subsequent object to be processed, thus maximizing the object throughput rate. The circuit diagram for the dual rate, high pass filter 78 is shown in FIG. 7.

Figure 8:
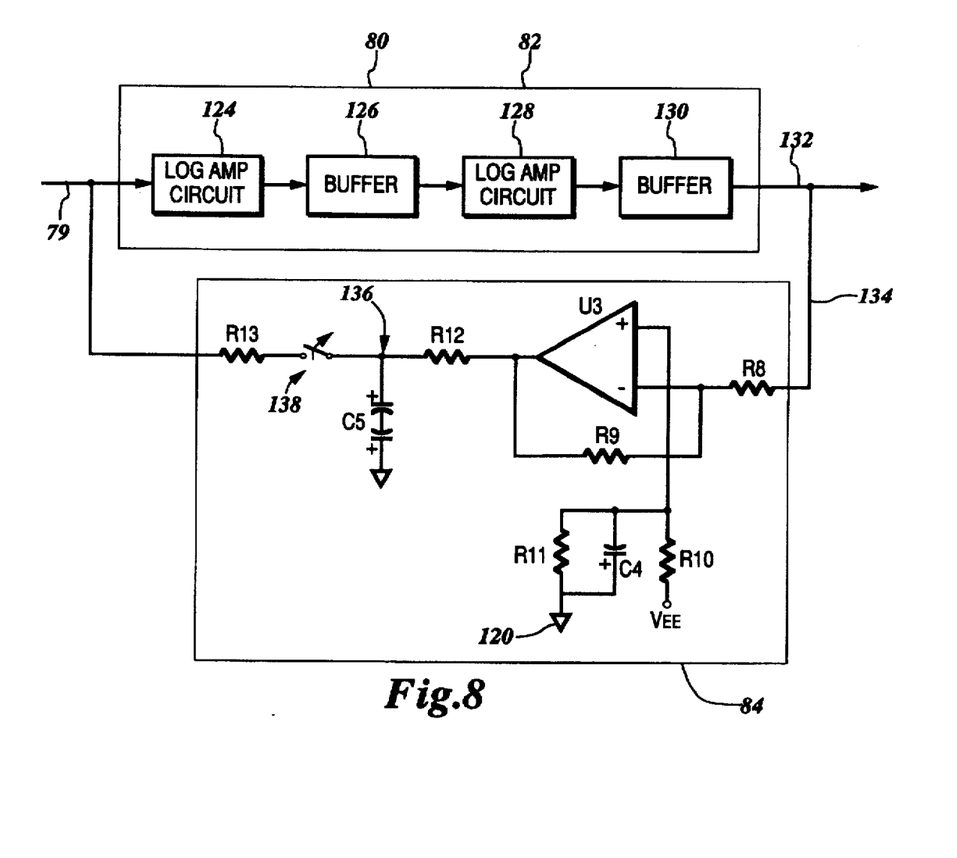
FIG. 8 is a circuit diagram for one of the chained logarithmic amplifier circuit with auto-zeroing for the system of FIGS. 1 and 2.

The processing circuit 32 is connected to receive the detector output signals generated by both detector circuits 30 for the right and left receive coils 28r and 28l, respectively. The processing circuit 32 includes a pair of chained logarithmic amplifier circuits 80 and 82, each one connected to process one of the received detector output signals on lines 79r and 79l. The chained logarithmic amplifier circuits 80 and 82 are implemented with operational transconductance amplifiers, stabilized with a windowed threshold type comparator. The transconductance amplifiers further provide a multiple-pole, variable low pass filter function that enhances system noise immunity. Each logarithmic amplifier circuit 80 and 82 further includes an auto-zeroing feedback circuit 84 to compensate for thermal drift and background noise. The circuit diagram for one of the logarithmic amplifier circuit 80 and 82 along with auto-zeroing feedback circuit 84 is shown in FIG. 8.

When an object moves through the passageway 26 closer to one receive coil 28 than another, the signal derived from the close coil receives a relatively intense and quick processing response from the logarithmic amplifier circuits 80 and 82, while the signal derived from the distant coil receives a relatively weaker and slower response. A weak detector output signal indicative of the detection of a small or distant metal object in the passageway 26 is significantly amplified by the variable low pass filters of the circuits 80 and 82 in accordance with a long integration time constant. Conversely, a strong detector output signal indicative of the detection of a large or close metal object is subjected to a short integration time constant and is only slightly amplified. This selective amplification of the detector output signals is in effect taking the cube root of the output detector signal, and functions to compensate for the known near field inverse cube law attenuation characteristics of the receive coils 28. Thus, the system 10 will possess a wide dynamic range. It will, of course, be understood that in a digital implementation of the processor circuit 32, a precise cube root of the detector output signal will be taken.

Up to this point, the signals derived by the system from the sensing of the electromagnetic field 24 by the right and left receive coils 28r and 28l, respectively, have been maintained separate from each other. The processing circuit further includes a pair of multiplier circuits 86 and 88. The first multiplier circuit 86 multiplies a cube root signal A output from the logarithmic amplifier 80 by a cube root signal B output from the logarithmic amplifier 82. This signal multiplication operation generates an output signal C in accordance with the following equation:

$$C=(xA)*(yB).$$

Similarly, the second multiplier circuit 88 multiplies the signal A by the signal B. However, the multiplication generates an output signal D in accordance with the following equation:

$$D=(yA)*(xB).$$

The multiplication coefficients x and y in the two above equations are selected empirically as calibration factors. With correct selection, a predetermined voltage level output at C and D will be achieved regardless of placement of the detected metal object in the field 24.

The cube root signals A and B output from the logarithmic amplifiers 80 and 82 may be further processed to identify the approximate horizontal location of any detected object. The strength of the signals A and B is related to both the proximity of an object to the receive coils 28r and 28l, respectively, and the metal mass of the object. A dual channel LED bar graph device 85 is connected to outputs from the chained logarithmic amplifiers 80 and 82 and includes a signal strength measuring circuit driven by the output cubed root signals A and B. The higher the strength of the output cubed root signal, the more LEDs in the device 85 that will be lit and the more likely that the detected object is proximate to corresponding receive coil 28'. When the signals are approximately equal, the object is most likely centrally located in the field 24. The bar graph device 85 further includes a display hold circuit for holding LED display of the peak signal strength, thus allowing security personnel to review the location indication provided by the LED display after the person or article has passed through the field 24.

The multiplication output signals C and D are cross coupled by a pair of difference amplifiers 90 and 92. The first difference amplifier 90 subtracts the output signal D from the output signal C to generate an output signal E in accordance with the following equation:

$$E = 2C - D.$$

Similarly, the second difference amplifier 92 subtracts the output signal C from the output signal D to generate an output signal F in accordance with the following equation:

$$F = 2D - C.$$

The processing circuit 32 further includes a select circuit 94 that receives the difference output signals E and F from the difference amplifiers 90 and 92, respectively, and outputs a signal G comprising the one of the signals E or F that has the weaker signal level. Thus, if select circuit 94 determines that E<F, then signal E will be output from the select circuit as signal G. Conversely, if select circuit 94 determines that F<E, then signal F will be output from the select circuit as signal G.

The output signal G has a signal level indicative of the total mass of metal detected in the electromagnetic field 24. The signal G is applied to one input of a comparator 96, with the other input to the comparator comprising an adjustable signal H generated by a sensitivity threshold circuit 98. If the signal level of the signal G is greater than the signal level of the signal H, then an illicit metal object has been detected, and the alarm 34 is actuated. By way of the sensitivity threshold circuit 98, the level of the signal H may be adjusted to control the sensitivity of the system 10 and minimize the incidence of undesired metal alarms.

Figure 4:
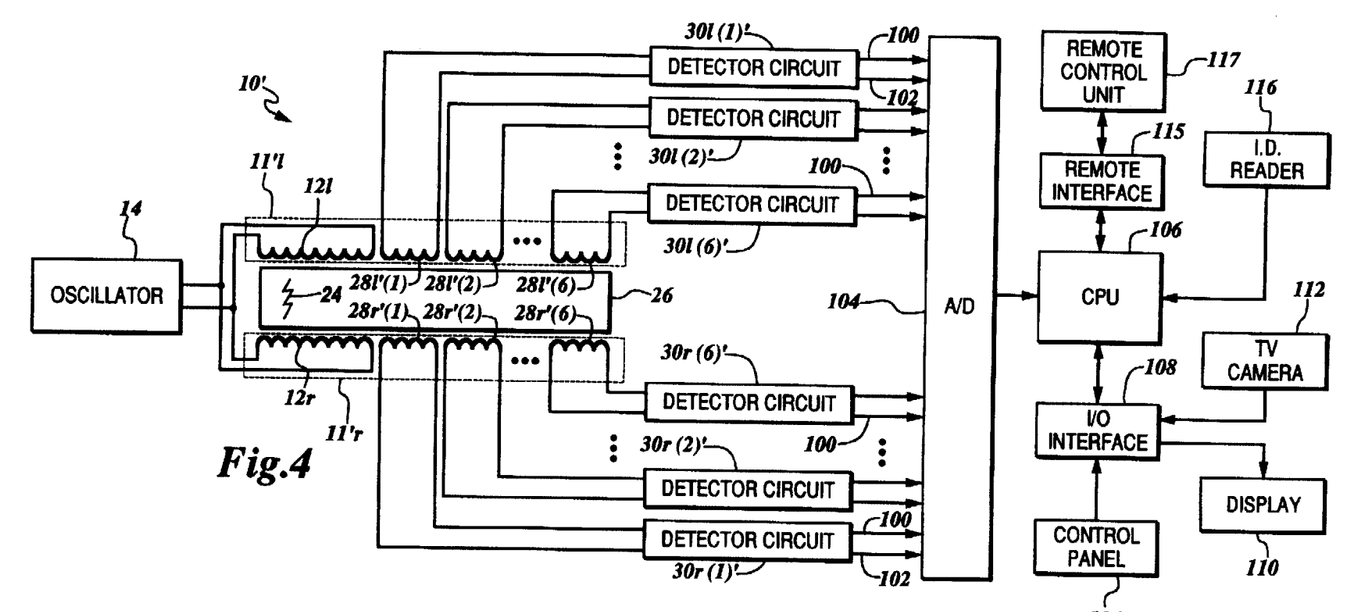
FIG. 4 is a block diagram of a second embodiment of the metal detection system of the present invention.

Reference is now made to FIG. 4, wherein there is shown a block diagram of a second embodiment of the metal detection system 10' of the present invention. Like the system 10 of FIG. 1, the second embodiment also utilizes a split field generation coil 12 that is excited in phase by the oscillator 14 to generate a single alternating current electromagnetic field 24 concentrated with substantially uniform field density in the passageway 26.

In the system 10', however, the electromagnetic field 24 is sensed by a plurality of receive coils 28r' for the right side coil set 11r', and a plurality of receive coils 28l' for the left side coil set 11l'. In the preferred embodiment, six individual receive coils 28'(1) through 28'(6) are disposed in each coil set 11' on either side of the passageway 26. Due to the added system complexity provided by the utilization of twelve receive coils, digital signal processing techniques are preferably used to identify the presence of illicit metal objects in the field. The use of multiple receive coils 28' in each coil set 11' allows for several metal objects in the field 24 to be individually detected and interpolated. This enables the system 10' to differentiate between a single object with a large metal mass and multiple objects with smaller metal masses.

Figure 9:
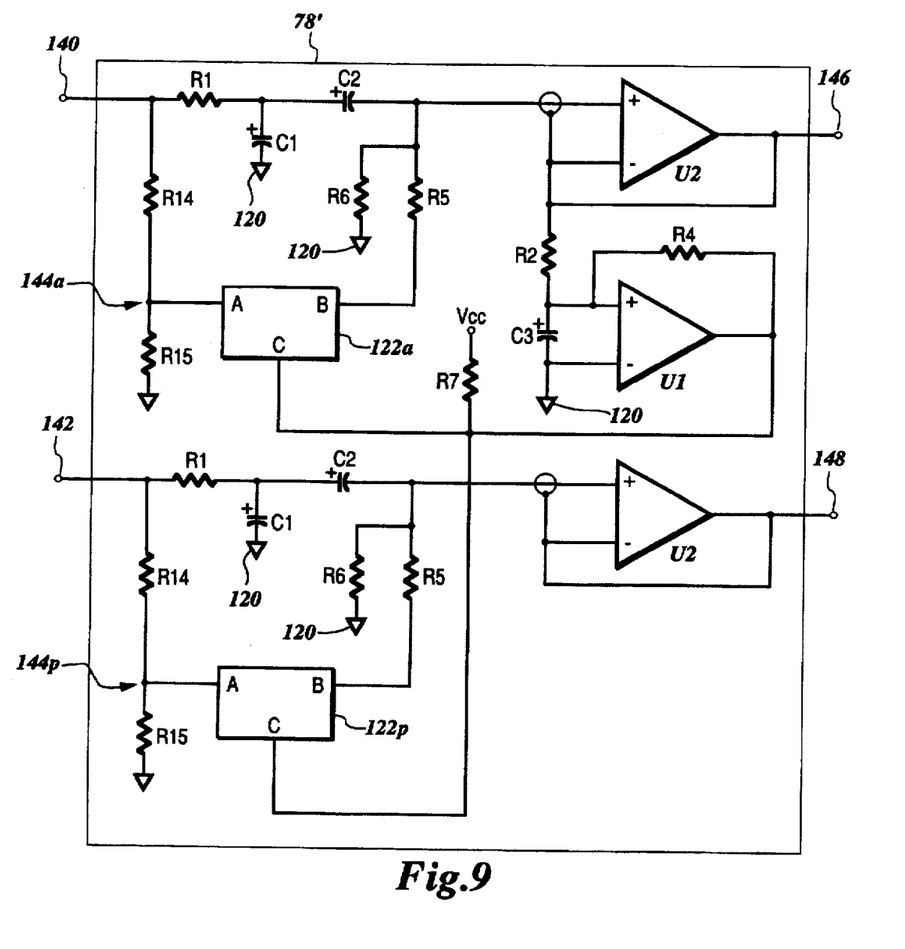
FIG. 9 is a circuit diagram for dual signal, dual rate, high pass filter for the system of FIGS. 4 and 5.

Each receive coil 28' is connected to a corresponding detector circuit 30' that detects any disturbances in the electromagnetic field 24 sensed by the coils 28'. Each detector circuit 30' is similar in configuration to the detector circuit 30 shown in FIGS. 1 and 2, except that the DC coupled phase 66 and amplitude 68 outputs from the quadrature detector 64 are low pass filtered at 74(1)' and 74(2)', and further processed by a dual signal type, dual rate high pass filter 78' (see, FIG. 5) that outputs a low pass filtered (at 99(1) and 99(2)) phase 100 and amplitude 102 detection signal from the detector circuit 30'. The high pass filter 78' is further modified to allow a slight DC signal output that is measured by the processing circuitry of the system 10' to determine in a system self-test operation mode if one of the channels is being overloaded. Each of the low pass filters 74(1)' and 74(2)' utilize a single pole low pass filter design. Each of the low pass filters 99(1) and 99(2) utilize a two pole, anti-aliasing low pass filter design. The circuit diagram for the dual signal type, dual rate high pass filter 78' is shown in FIG. 9.

The system 10' further includes a multiple channel, twelve bit analog-to-digital converter 104 to convert the plurality of complex analog phase and amplitude detection signals output on lines 100 and 102 from each of the detector circuits 30'. A central processing unit 106 utilizes digital signal processing techniques to process the digitized plurality of detection signals into a digitized image of the object(s) detected in the electromagnetic field 24. In processing the detection signals, the central processing unit 106 performs similar cubed root, multiplication and differentiation mathematical processes on the detector signals as performed by the processing circuit 32 in the analog system 10 to detect individual object metal mass.

Each detected object mass is then compared by the processing unit 106 to a predetermined sensitivity threshold to determine if any object has sufficient metal mass to be considered an illicit metal object. For each object so determined, an alarm is sounded and the processor outputs, through the input-output interface 108 for presentation on display 110, a digitized metal image representing the metal mass and metal type of each detected object. Furthermore, the object image is positioned on the display 110 in accordance its approximate detected location within the electromagnetic field 24 to facilitate further investigation by security personnel. The processor 106 further has the capability of overlaying the displayed location of the illicit detected object on an image of a person or article received from a television camera 112 to assist the security personnel in locating the object on the person or article. A control panel 114 is also provided to allow security personnel to control and program operation of the system 10', and a remote interface 115 is provided to allow the system to communicate with external systems such as a security system.

The remote interface 115 is also available to communicate with a hand held remote control unit 117 that is similar to a remote control pad for a car alarm. The remote control unit 117 is used to change the predetermined sensitivity threshold of the central processing unit 106 to determine if any object has sufficient metal mass to be considered an illicit metal object. Such a remote unit 117 is useful in adjusting the predetermined sensitivity settings when the security system operator detects certain individuals who fit a visual or behavioral profile which heightens the concern of the operator.

By appropriately programming the central processing unit 106, the implemented digital signal processing techniques facilitate system 10' operation to ignore the detection of certain types of known objects with relatively large metal masses (e.g., steel toed boots) that typically trigger alarms. Furthermore, test objects may be placed in the field 24 and sampled by the system 10' to program system response to certain objects. Programming of the system 10' may also be implemented through the downloading of object detection (metal mass) data from a disk or via a modem into the central processing unit 106.

The use of multiple receive coils 28' along with digital signal processing of the detector signals further facilitates the differentiation between objects of different metal types. Thus, the system will operate to distinguish between ferrous and non-ferrous metal objects, and furthermore will distinguish degrees of metal composition (e.g., copper versus silver). This prevents an undesired metal alarm to be caused by the lumping of the ferrous and non-ferrous detections into a single metal mass. The multiple receive coils 28' along with digital signal processing techniques further facilitate the differentiation of metal objects by location within the field 24. This prevents an undesired metal alarm to be caused by the lumping of detections in separate locations into a single metal mass. In combination, these benefits enable the system 10' to determine that no alarm should be signalled when two objects of differing metal types (such as a brass set of keys and a steel lighter) at different locations (in the left and right pockets) are sensed, when the combination of such sensed metal objects would typically cause an undesired metal alarm.

The system 10' further includes an identification reader 116 for scanning persons or articles passing through the passageway 26 for an identification code. Such a reader 116 may scan identification cards or bracelets (each recording such a code) carried by persons or attached to articles. Known persons and articles that repeatedly pass through the passageway will be initially scanned and a typical metal pattern resulting from the scan stored by the central processing unit 106 in a file associated with the person's or article's scanned identification code. The next time the person or article passes through the passageway, the identification code is read by the reader 116 and the metal pattern detected by the system 10' is compared by the central processing unit 106 to the typical metal pattern stored for the read code. Detected deviations between the typical and presently sensed metal patterns are then used to identify the presence of illicit metal objects.

In a third embodiment of the present invention, by appropriately programming the central processing unit 106, system 10' identifies specific metal objects by digitally processing voltage signals, amplitude signals, and metal mass signals for the specific object. The three signals are digitally modeled to provide a distinctive identification signature. The distinctive signature is compared to reference signatures for known objects in the central processor unit memory. The likely identity of the specific object in question is output to the display 110 pictorially, textually or by an audible alarm signal. To create the reference signature, a known test object, for example a 45 caliber gun, is placed in the field 24 and sampled by the system 10' to input voltage signals, amplitude signals and metal mass signals. The three signals are digitally modeled to provide a distinctive identification signature which is stored in the memory of the central processing unit 106. Input of the reference signature for the known object may also be implemented through the downloading of the signature characteristics from a disk or via a modem into the central processing unit 106.

It is preferable that the entire system be implemented digitally. Accordingly, a dual signal type, dual rate high pass filter 78' may be replaced by a high resolution sixteen bit analog-to-digital converter with programmable offsets. Furthermore, a high speed, high resolution analog-to-digital converter may be substituted for nearly all the analog circuitry shown in the detector circuit 30'.

Figure 6:
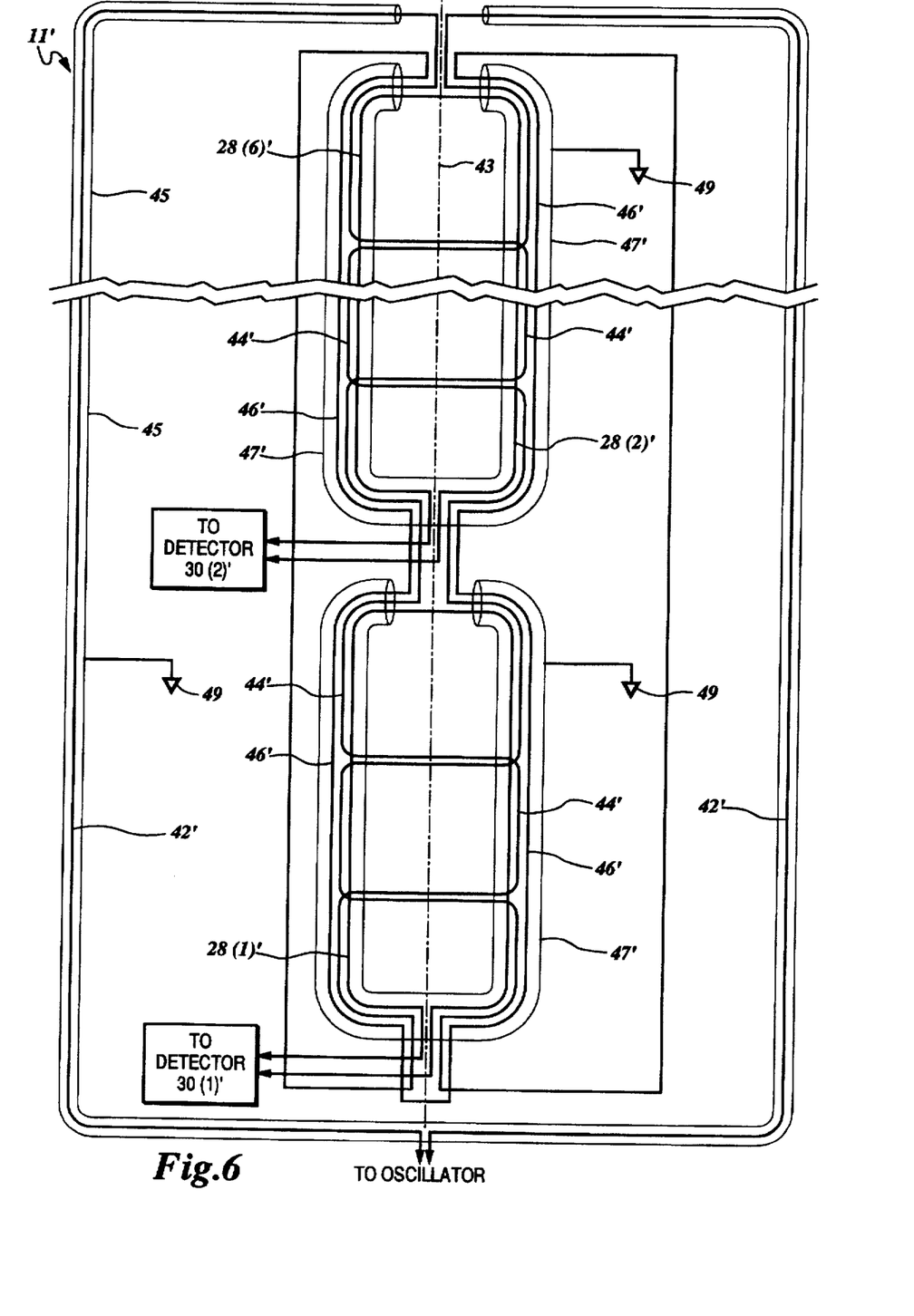
FIG. 6 illustrates the geometry of one of the transmit-receive coils in the second embodiment of the metal detection system shown in FIG. 4.

The split field generation coil 12 in each coil set 11' is preferably comprised of a series connected transmit coil 42', null adjust loop 44', and feedback coil 46'. Reference is now made to FIG. 6, wherein there is shown the geometry of the coil set 11' of FIG. 4 positioned on one side of the passageway 26. It will, of course, be understood that a mirror image of the coil geometry illustrated in FIG. 6 is present in the coil set 11' on the opposite side of the passageway 26.

The transmit coil 42' for the field generation coil 12 has rounded corners and an elongated rectangular shape having a longitudinal axis 43 of symmetry. The six receive coils 28'(1) through 28'(6) each have an elongated rectangular shape with rounded corners, are coaxially aligned along the axis 43 and oriented co-planar with the transmit coil 42'. The null adjust loop 44' and feedback coil 46' are co-located with the plurality of receive coils 28', and thus are comprised of a corresponding plurality of serially connected sections, each section having a substantially identical size and shape as the corresponding receive coil. Each section of the null adjust loop 44' further includes a plurality of null adjust wire crossover points for shaping the generated electromagnetic field 24.

The transmit coil 42' is shielded with a resistive Faraday split section tubular shield 45 that is terminated to system ground 49. Each receive coil 28' along with its corresponding section of the feedback coil 46' are gathered together and also shielded with a resistive Faraday split section tubular shield 47' that is terminated to system 10 ground. Termination of the shields 45 and 47' to system ground provides primary electromechanical interference and radio frequency interference suppression. Openings in the tubular shields 45 and 47' are selectively located near the longitudinal ends of the coils to minimize loading of the generated electromagnetic field 24.

Reference is now made to FIG. 7, wherein there is shown a circuit diagram for the dual rate, high pass filter 78 for the system 10 of FIGS. 1 and 2. Resistor R1 and capacitor C1 form the input low pass filter 74 (see FIG. 2) for filtering the summed amplitude 66 and phase 68 signals output from the quadrature detector 64. The filtered signal is passed through capacitor C2 functioning as a DC blocking high pass filter. The positive (+) and negative (−) inputs to high impedance, low offset operational amplifier U1 are connected to the capacitor C2 through a guarded input 118. The output of the amplifier U1 is also connected to the negative (−) input and to a feedback loop containing resistor R2 connected to the positive (+) input of an operational amplifier U2 configured as a comparator with a slight low pass filtering function. The negative (−) input of the amplifier U2 is connected to ground 120 and to resistor R2 through a capacitor C3. The output of the amplifier U2 is connected to the positive (+) input through a resistor R4, and to a continuation of the feedback loop leading to the control port C of analog switch 122. Port A of the switch 122 is connected to ground 120, and port B of the switch is connected through a resistor R5 to the positive (+) input of the amplifier U1 and to capacitor C2. A resistor R6 is also connected from the negative (−) input of the amplifier U1 and capacitor C2 to ground 120. Resistor R7 functions as a pull-up resistor for the portion of the feedback loop leading to the control port C of analog switch 122. When switch 122 is actuated to port B by the feedback signal at port C, resistor R5 is grounded 120 and the circuit functions in fast rate operational mode described above. Conversely, when the switch 122 is not actuated, resistor R6 controls circuit operation in slow rate operational mode.

Reference is now made to FIG. 8, wherein there is shown a circuit diagram for one of the chained logarithmic amplifier circuits 80 or 82 with auto-zeroing 84 for the system 10 of FIGS. 1 and 2. The chained logarithmic amplifier circuit comprises a first logarithmic amplifier circuit 124 implemented with two LM13600N type operational amplifiers and connected to input line 79, a first buffer circuit 126, a second logarithmic amplifier circuit 128 also implemented with two LM13600N type operational amplifiers, and a second buffer circuit 130 outputting to a line 132. Connected to output line 132 is a feedback line 134, with a resistor R8 connecting the feedback line 134 to the negative (−) input of the operational amplifier U3 configured as a comparator. The output of the amplifier U3 is connected to the negative (−) input through a resistor R9. The positive (+) terminal of the amplifier U3 is connected to Vee through a resistor R10, and to ground 120 through a parallel combination of resistor R11 and capacitor C4. The resistors R10 and R11 function as a voltage divider to set the operating point of the amplifier U3. The capacitor C4 acts as a noise filter. The output of the operational amplifier U3 is connected to a low pass filter circuit 136 comprised of a resistor R12 and a non-polarized electrolytic capacitor C5. The output of the low pass filter circuit 136 is connected to the input line 79 of the chained logarithmic amplifier circuit 80 or 82 through a switch 138 and a resistor R13. The signal output from the low pass filter 136 comprises a square wave that tracks the background and thermal noise passing through the chained logarithmic amplifier circuit 80 or 82. When fed back to the input line 79 of the chained logarithmic amplifier circuit 80 or 82, this noise component is subtracted from the signal. The switch 138 allows the auto-zeroing circuit 84 to be turned off, thus allowing the chained logarithmic amplifier circuit 80 or 82 to be calibrated.

Figure 5:
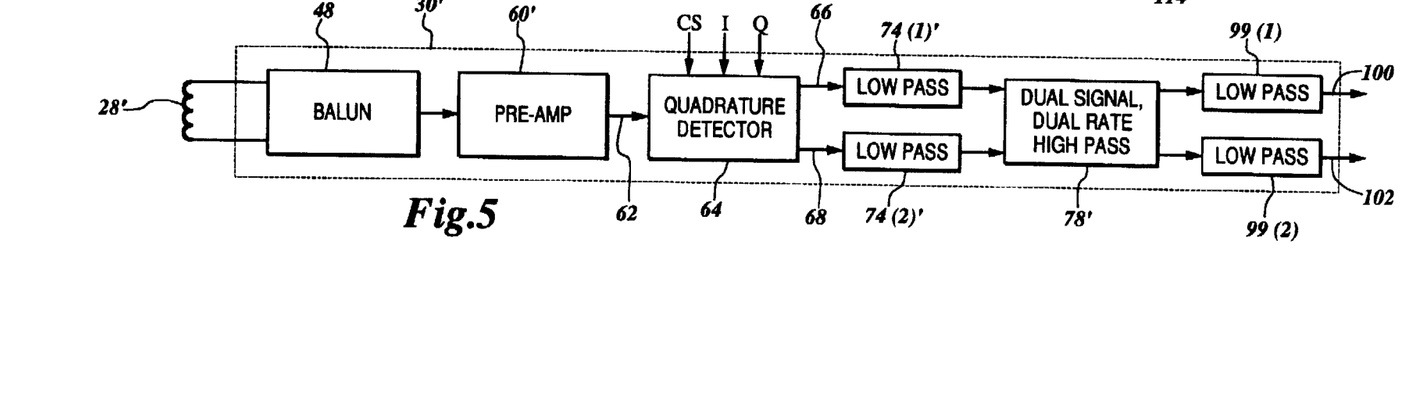
FIG. 5 is a block diagram of the detector circuit for the system of FIG. 4.

Reference is now made to FIG. 9, wherein there is shown a circuit diagram for the dual signal, dual rate, high pass filter 78' for the system 10' of FIGS. 4 and 5. The filter 78' includes both an amplitude input 140 and a phase input 142. The filter 78' is identical to the filter 78 of FIG. 7, except in the following ways. The filter includes input filter and rate selection circuit for the phase component. Thus, the amplitude and phase inputs 140 and 142 are connected to port A of their respective switches 122a and 122p through voltage dividers 144a and 144p, respectively, comprised of resistors R14 and R15. The voltage dividers 144 allow a little of the DC component of the signals at the amplitude and phase inputs 140 and 142 to reach the amplitude and phase outputs 146 and 148. Furthermore, it will be noted that the switch 122p on the phase side of the filter 78' is not driven by its own comparator, but is rather driven by the feedback output from the amplitude side comparator U2 driving switch 122a.

Although multiple embodiments of the metal detection system of the present invention have been illustrated in the accompanying Drawings and described in the foregoing Detailed Description, it will be understood that the invention is not limited to the embodiments shown, but is capable of numerous rearrangements, substitutions and modifications without departing from the spirit of the invention.

We claim:

1. A metal detection system, comprising:

an oscillator;

a field generation coil connected to and excited by the oscillator to generate an electromagnetic field disrupted by the presence of metal objects therein;

a plurality of first receiver coils positioned on one side of a passageway through which metal objects pass for receiving the generated electromagnetic field;

a plurality of second receiver coils positioned on another side of the passageway for receiving the generated electromagnetic field;

a plurality of detector circuits connected in one-to-one correspondence to each of said first and second plurality of receiver coils, each detector circuit including means for detecting the disruption of the electromagnetic field received by the corresponding receiver coil and outputting a detection signal indicative thereof;

means for receiving and processing the detection signals output from the detector circuits to generate a mass signal indicative of the metal mass of each individual metal object detected disrupting the electromagnetic field;

means for processing the detection signals output from the detector circuits to generate a digitized image of each individual metal object detected disrupting the electromagnetic field;

means for comparing each generated mass signal to a threshold signal; and means for outputting an alarm indication when any individual mass signal exceeds the threshold signal.

2. A metal detection system, comprising:

an oscillator;

a field generation coil connected to and excited by the oscillator to generate an electromagnetic field disrupted by the presence of metal objects therein;

a plurality of first receiver coils positioned on one side of a passageway through which metal objects pass for receiving the generated electromagnetic field;

a plurality of second receiver coils positioned on another side of the passageway for receiving the generated electromagnetic field;

a plurality of detector circuits connected in one-to-one correspondence to each of said first and second plurality of receiver coils, each detector circuit including means for detecting the disruption of the electromagnetic field received by the corresponding receiver coil and outputting a detection signal indicative thereof;

means for receiving and processing the detection signals output from the detector circuits to generate a mass signal indicative of the metal mass of each individual metal object detected disrupting the electromagnetic field;

means for comparing each generated mass signal to a threshold signal;

means for outputting an alarm indication when any individual mass signal exceeds the threshold signal;

remote control means for adjusting the predetermined threshold signal; and interface means for communicating with said remote control means.

3. A metal detection system, comprising:

an oscillator;

a field generation coil connected to and excited by the oscillator to generate a substantially uniform vertical electromagnetic field density disrupted by the presence of metal objects therein;

a plurality of vertically distributed first receiver coils positioned on one side of a passageway through which metal objects pass for receiving the generated electromagnetic field;

a plurality of vertically distributed second receiver coils positioned on another side of the passageway for receiving the generated electromagnetic field;

a plurality of detector circuits connected in one-to-one correspondence to each of said first and second plurality of receiver coils, each detector circuit including means for detecting the disruption of the electromagnetic field received by the corresponding receiver coil and outputting a detection signal indicative thereof;

means receiving and processing the detection signals output from the detector circuits for generating a position signal indicative of the approximate horizontal and vertical location of each individual metal object detected disrupting the electromagnetic field and for generating an individual mass signal corresponding to a position signal indicative of the metal mass of each individual metal object;

means for comparing each generated individual mass signal to a threshold signal; and means for outputting an alarm indication when any individual mass signal exceeds the threshold signal.

4. A metal detection system, comprising:

an oscillator;

a field generation coil connected to and excited by the oscillator to generate an electromagnetic field disrupted by the presence of metal objects therein;

a plurality of first receiver coils positioned on one side of a passageway through which metal objects pass for receiving the generated electromagnetic field;

a plurality of second receiver coils positioned on another side of the passageway for receiving the generated electromagnetic field;

a plurality of detector circuits connected in one-to-one correspondence to each of said first and second plurality of receiver coils, each detector circuit including means for detecting the disruption of the electromagnetic field received by the corresponding receiver coil and outputting a detection signal indicative thereof;

means for receiving and processing the detection signals output from the detector circuits to generate a mass signal indicative of the metal mass of each individual metal object detected disrupting the electromagnetic field;

means for differentiating between an individual mass signal for ferrous metal object and an individual mass signal for non-ferrous metal object;

means for comparing each generated individual mass signal for a ferrous object to a threshold signal for a ferrous object;

means for comparing each generated individual mass signal for a non-ferrous object to a threshold signal for a non-ferrous object; and means for outputting an alarm indication when any individual mass signal exceeds its associated threshold signal.

5. A metal detection system, comprising:

an oscillator;

a field generation coil connected to and excited by the oscillator to generate an electromagnetic field disrupted by the presence of metal objects therein;

a plurality of first receiver coils positioned on one side of a passageway through which metal objects pass for receiving the generated electromagnetic field;

a plurality of second receiver coils positioned on another side of the passageway for receiving the generated electromagnetic field;

a plurality of detector circuits connected in one-to-one correspondence to each of said first and second plurality of receiver coils, each detector circuit including means for detecting the disruption of the electromagnetic field received by the corresponding receiver coil and outputting a detection signal indicative thereof;

means receiving and processing the detection signals output from the detector circuits for generating a mass signal indicative of the metal mass of each individual metal object detected disrupting the electromagnetic field;

means for differentiating between individual mass signals for preselected metal compositions for metal objects;

means for comparing each generated individual mass signal for a preselected metal composition for a metal object to a threshold signal for the particular metal composition; and means for outputting an alarm indication when any individual mass signal exceeds the associated threshold signal.

6. A metal detection system, comprising:

an oscillator;

a field generation coil connected to and excited by the oscillator to generate an electromagnetic field disrupted by the presence of metal objects therein;

a plurality of first receiver coils positioned on one side of a passageway through which metal objects pass for receiving the generated electromagnetic field;

a plurality of detector circuits connected in one-to-one correspondence to each of said plurality of receiver coils, each detector circuit including means for detecting the disruption of the electromagnetic field received by the corresponding receiver coil and outputting a detection signal indicative thereof;

means for receiving and processing the detection signals output from the detector circuits to generate a distinctive identification signature for each individual metal object detected disrupting the electromagnetic field, said identification signature comprising a voltage signal, amplitude signal, and metal mass signal;

means for storing identification signatures for known metal objects;

means for retrieving the stored identification signature for a known object;

means for comparing the retrieved identification signature for a known object with the identification signature of each individual metal object detected disrupting the electromagnetic field to identify the metal object detected;

means for outputting an identifying signal for the metal object detected and identified; and means for displaying the identifying signal.

7. The metal detection system of claim 6 wherein the identifying signal comprises a digitized pictorial image.

8. The metal detection system of claim 6 wherein the identifying signal comprises a digitized textual image.

9. The metal detection system of claim 6 including means responsive to the identifying signal to generate an audible alarm.

10. The metal detection system of claim 6 wherein the means for storing further comprises:

means for downloading the identification signature of known metal objects; and means for storing the downloaded identification signature.

11. A metal detection system, comprising:

a coil set for generating and responding to an electromagnetic field;

means coupled to the coil set for detecting a disruption of the electromagnetic field by the presence of a metal object, said detecting means includes outputting at least one detection signal; and a processor for receiving and processing the at least one detection signal, said processor including:

means for taking the cube root of the detection signals to output corresponding cube root signals;

means for redundantly multiplying the cube root signals to output multiplication signals;

means for differentiating the multiplication signals to output differential signals; and means for selecting the lesser of the output differential signals to output a mass signal indicative of the presence of the metal object disrupting the electromagnetic field.

12. The metal detection system in accordance with claim 11 wherein the means for taking the cube root of the detection signals comprises a chained logarithmic amplifier for processing the detection signal to output the corresponding cube root signals.

13. The metal detection system as in claim 11 wherein the cube root signals comprise a first and second cube root signal, and the means for redundantly multiplying comprises:

means for multiplying the first root signal (A) by the second root signal (B) to output a first multiplication signal (C) in accordance with the equation C=(xA)* (yB); and means for multiplying the first root signal (A) by the second root signal (B) to output a second multiplication signal (D) in accordance with the equation D=(yA)* (xB);

wherein x and y are calibration factors selected such that the multiplication signals will be substantially identical for a given metal object independent of location within the electromagnetic field.

14. The metal detection system as in claim 11 wherein the multiplication signals comprise a first multiplication signal and a second multiplication signal, and the means for differentiating comprises:

means for subtracting the second multiplication signal from a multiple of the first multiplication signal to output a first differential signal; and means for subtracting the first multiplication signal from a multiple of the second multiplication signal to output a second differential signal.

15. The metal detection system in accordance with claim 11 wherein the coil set further includes:

a field generation coil that generates the electromagnetic field, said field generation coil divided at substantially a midpoint into a first coil part and second coil part, and means for electrically connecting the first and second coil parts in parallel;

a first receiver coil responsive to the generated electromagnetic field, said first receiver coil and the first coil part of the field generation coil positioned co-planar and coaxially aligned with each other;

a second receiver coil responsive to the generated electromagnetic field, said second receiver coil and second coil part of the field generation coil positioned co-planar and coaxially aligned with each other.

* * * * *